(12) United States Patent
Kandziora et al.

(10) Patent No.: US 8,487,905 B2
(45) Date of Patent: Jul. 16, 2013

(54) ELECTRODE ARRANGEMENT FOR DISPLAY DEVICE

(75) Inventors: Thomas Kandziora, Schwabhausen (DE); Peter Fasshauer, Neubiberg (DE)

(73) Assignee: Ident Technology AG, Wessling (DE)

( * ) Notice: Subject to any disclaimer, the term of this patent is extended or adjusted under 35 U.S.C. 154(b) by 0 days.

(21) Appl. No.: 12/810,363

(22) PCT Filed: Jun. 15, 2010

(86) PCT No.: PCT/EP2010/058418
§ 371 (c)(1),
(2), (4) Date: Mar. 29, 2011

(87) PCT Pub. No.: WO2010/149543
PCT Pub. Date: Dec. 29, 2010

(65) Prior Publication Data
US 2012/0081328 A1 Apr. 5, 2012

(30) Foreign Application Priority Data

Jun. 24, 2009 (DE) .................. 10 2009 030 495
Oct. 30, 2009 (DE) .................. 10 2009 051 409

(51) Int. Cl.
*G06F 3/045* (2006.01)
(52) U.S. Cl.
USPC .................. 345/174; 345/173; 178/18.06
(58) Field of Classification Search
USPC .... 345/156, 173, 174, 179; 178/18.05–18.07, 178/19.03; 333/215
See application file for complete search history.

(56) References Cited

U.S. PATENT DOCUMENTS

| | | | |
|---|---|---|---|
| 5,847,690 A * | 12/1998 | Boie et al. ............... | 345/104 |
| 7,339,579 B2 | 3/2008 | Richter | |
| 8,017,884 B2 * | 9/2011 | Huang et al. ............ | 200/600 |
| 8,305,358 B2 * | 11/2012 | Klinghult et al. ....... | 345/174 |
| 2005/0184965 A1 * | 8/2005 | Geaghan et al. ........ | 345/173 |
| 2006/0132462 A1 | 6/2006 | Geaghan | |
| 2006/0227114 A1 * | 10/2006 | Geaghan et al. ........ | 345/173 |
| 2006/0250373 A1 * | 11/2006 | Sakurai et al. .......... | 345/173 |
| 2008/0018608 A1 | 1/2008 | Serban | |
| 2008/0158178 A1 * | 7/2008 | Hotelling et al. ....... | 345/173 |
| 2008/0316182 A1 | 12/2008 | Antila | |
| 2009/0096761 A1 | 4/2009 | Cho | |
| 2009/0256818 A1 * | 10/2009 | Noguchi et al. ........ | 345/174 |
| 2010/0001973 A1 * | 1/2010 | Hotelling et al. ....... | 345/174 |
| 2010/0045632 A1 * | 2/2010 | Yilmaz et al. .......... | 345/174 |
| 2010/0060489 A1 * | 3/2010 | Fasshauer ............... | 341/20 |
| 2010/0078231 A1 * | 4/2010 | Yeh et al. ............... | 178/18.05 |
| 2010/0214232 A1 * | 8/2010 | Chan et al. ............. | 345/173 |

FOREIGN PATENT DOCUMENTS

WO WO 2008064864 A2 * 6/2008

* cited by examiner

*Primary Examiner* — Joe H Cheng
(74) *Attorney, Agent, or Firm* — King & Spalding L.L.P.

(57) ABSTRACT

The invention provides an electrode arrangement for a capacitive sensor device and for a capacitive sensor, respectively, for detecting a position and/or an approach of an object, which comprises a sensor electrode and a first shield electrode, wherein the sensor electrode is arranged on a first side of a substantially flat substrate with a first side and a second side, and wherein the first shield electrode is arranged on the second side of the substrate and serves for shielding the alternating electric field emitted by the sensor electrode from ground. There is also provided a foil with an electrode arrangement according to the invention as well as a method for the production of a display arrangement with an electrode arrangement according to the invention.

Figure 1:
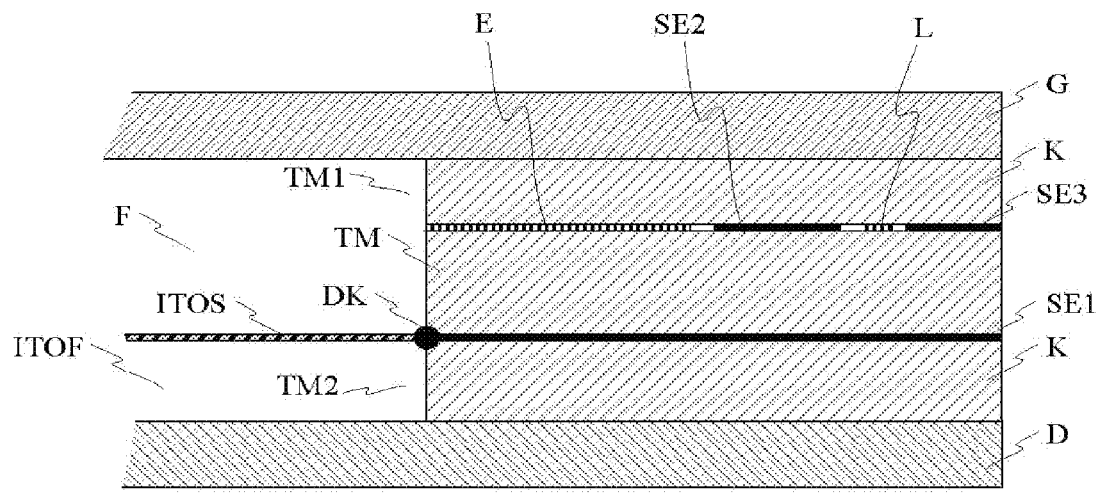

33 Claims, 10 Drawing Sheets ing the functionality of the screens by a detection of the approach to the screen or a detection of gestures near the screen, in order to manually control, for example, image movements like browsing and/or rotating electronic documents on the screen, without touching the screen.
ELECTRODE ARRANGEMENT FOR DISPLAY DEVICE

CROSS REFERENCE TO RELATED APPLICATIONS

This application is the US national stage of PCT application PCT/EP2010/058418, filed 15 Jun. 2010, published 29 Dec. 2010 as WO2010149543, and claiming the priority of German patent application 102009030495.9 itself filed 24 Jun. 2009 and German patent application 102009051409.0 itself filed 30 Oct. 2009, whose entire disclosures are herewith incorporated by reference.

FIELD OF THE INVENTION

The invention relates to an electrode arrangement for a capacitive sensor device and for a capacitive sensor, respectively, for detecting a position and/or an approach of an object. The invention particularly concerns an electrode configuration for a display device for detecting a position and/or an approach of an object to the display device using the electrode arrangement according to the invention. Moreover the invention relates to a foil on which components of the system, in particular electrodes, are arranged. Moreover the invention relates to a method for the production of an proximity-sensitive display device using a touch-sensitive screen and using the foil according to the invention.

STATE OF THE ART

In case of screens or displays, particularly in case of monitors, mobile communication devices or navigation instruments there is a wish to extend the functionality of the screens by a detection of the approach to the screen or a detection of gestures near the screen, in order to manually control, for example, image movements like browsing and/or rotating electronic documents on the screen, without touching the screen.

A solution is provided by so-called capacitive systems. These known solutions however have the disadvantage, that they have only a small sensitivity, so that only an inexact detection of gestures is possible. There is to be added that in case of large screens, as they are used in office workstations, a gesture detection on a capacitive basis in the area of the middle of the screen is possible only with additional capacitive sensors arranged in the middle of the screen, which additionally increases the effort of evaluation.

Moreover there is a wish to extend touch-sensitive screens by the functionality of an approach or gesture detection, in order to be able to control or handle applications manually without contact also in case of touch-sensitive screens.

OBJECT OF THE INVENTION

The object of the invention is therefore to provide an electrode arrangement for a capacitive sensor device and a capacitive sensor, respectively, for detecting a position and/or an approach of an object, particularly a hand or a finger, which at least partially avoids the mentioned disadvantages and makes possible an improved sensitivity of the capacitive sensor device or the capacitive sensor as well as a subsequent extension of display devices, especially of contact sensitive display devices, by approach-sensitive functionality or gesture functionality.

SOLUTION ACCORDING TO THE INVENTION

According to the invention this object is solved by the subject matters of the independent claims. Advantageous embodiments of the invention are indicated in the respective dependent claims.

According to that an electrode arrangement is provided for a capacitive sensor device and for a capacitive sensor, respectively, for detecting a position and/or an approach of an object, comprising a sensor electrode and a first shield electrode, wherein the sensor electrode is arranged on a first side of a substantially flat substrate with a first side and a second side, and wherein the first shield electrode is arranged on the second side of the substrate and serves for shielding the alternating electric field emitted by the sensor electrode against mass (ground).

The electrode arrangement may comprise a second shield electrode, wherein the second shield electrode is arranged on the first side of the substrate, the sensor electrode may be coupled with evaluation electronics by means of a conductor path which is arranged at the first side of the substrate, the second shield electrode is arranged between the sensor electrode and the conductor path and at a distance from the sensor electrode and from the conductor path and serves for shielding an alternating electric field emitted by the sensor electrode against the conductor path, and the sensor electrode, the second shield electrode, and the conductor path each are stripe-shaped, wherein the second shield electrode is larger than the conductor path.

The sensor electrode may be larger than the conductor path.

The sensor electrode may be larger than the second shield electrode.

This electrode arrangement is especially distinguished by the fact that an improved sensitivity of the capacitive sensor system compared to conventional capacitive sensor systems is reached. With the first shield electrode the electric field of the sensor electrode may be shielded against the mass potential of the screen, which increases sensitivity considerably. As the second shield electrode is large compared to the conductor path, the influence of the conductor path on the sensor electrode is minimized or maintained particularly low. Additional means for shielding the conductor path are not necessary, which simplifies the production of the electrode arrangement and the integration of the electrode arrangement into a target system. As the sensor electrode is large compared to the conductor path, a high sensitivity of the sensor electrode is reached.

The electrode arrangement may comprise a third shield electrode, wherein the third shield electrode is arranged on the first side of the substrate at a distance from the conductor path, whereas the conductor path is arranged between the second shield electrode and the third shield electrode. Advantageously in this is way the lateral influence on the sensor electrode is further reduced or eliminated.

The sensor electrode, the second shield electrode, and the conductor path may be arranged substantially in parallel to each other. In this way the influence of the conductor path on the sensor electrode does not modify along the conductor path, which makes possible a simpler configuration of the second shield electrode arranged between the sensor electrode and the conductor path.

The first shield electrode may be formed by a conductive and to a great extent transparent material. The first shield electrode may be formed much larger than the overall width of sensor electrode, second shield electrode, third shield electrode and conductor path, so that also for display devices without electric conductive coatings a particularly sensitive detection is possible.

The first shield electrode may be DC-coupled or capacitively coupled with a conductive and to a great extent transparent layer. Thus, conventional contact sensitive screens may be equipped with a gestures or approximation detection, wherein the electric conductive coating of the contact sensitive screen is used in order to shield the electrode configuration against the mass (ground) of the screen.

The sensor electrode may be coupled with a resonance circuit, in which the system formed including the sensor electrode and the resonance circuit may be applied with an electric voltage, wherein a phase shift of an electric voltage of the resonance circuit compared to the electric voltage applied is indicative for the approach and/or the position of the object at the sensor electrode.

An output of the system formed including the sensor electrode and the resonance circuit may be switchable by means of an amplifying circuit on at least one of the three shield electrodes, in order to bring at least one of the three shield electrodes substantially to the electric potential of the sensor electrode.

In one embodiment an output of the system formed including the sensor electrode and the resonance circuit by means of a driver circuit is switchable on all three shield electrodes, in order to bring all three shield electrodes substantially to the electric potential of the sensor electrode.

The amplifying circuit may be formed as a driver circuit. The driver circuit may be adapted to drive the current at the at least one shield electrode and to charge the at least one shield electrode with an electric voltage in phase with the electrode voltage of the sensor electrode, wherein the electric voltage applied preferably is smaller than the electrode voltage of the sensor electrode.

In this way an almost field-free space between the sensor electrode and the shield electrodes can be generated, which positively influences the sensitivity of the capacitive sensor system.

The at least one coupling electrode may be arranged is between the sensor electrode and the first shield electrode and may be coupled with the first shield electrode. The output of the at least one capacitive sensor by means of the driver circuit may be switchable on the coupling electrode, in order to bring the coupling electrode and the first shield electrode substantially to the electric potential of the sensor electrode.

The driver circuit may be adapted to drive the current at the coupling electrode and to charge the coupling electrode with an electric voltage in phase with the electrode voltage of the sensor electrode, wherein the voltage applied is smaller than the electrode voltage of the sensor electrode.

The shield electrode and the coupling electrode may be capacitively coupled.

By means of a multiplexer several sensor electrodes may be coupled with the driver circuit.

The inductive component of the resonance circuit may be formed by a gyrator.

The gyrator may include an operational amplifier fed back by a capacitor, which at the input of the capacitive sensor acts as a virtual inductance, wherein the virtual inductance, together with the sensor electrode connected at the input of the capacitive sensor and its load capacitance against mass, constitutes a parallel resonant circuit.

The output of the operational amplifier may be coupled with the amplifying circuit, in which at the output of the operational amplifier an attenuator, preferably an ohmic voltage divider, is arranged.

There is also provided an electrode configuration for a display device for detecting a position and/or an approach of an object to the display device with at least one electrode arrangement according to the invention, wherein the electrode arrangement may be arranged in such a way at the display device that the second side of the substrate is orientated toward the display device and wherein the first shield electrode serves for shielding the alternating electric field emitted by the sensor electrode from the grounded display device.

The first shield electrode may be DC-coupled or capacitively coupled with a conductive and to a great extent transparent layer arranged in front of the display device.

The first shield electrode may be formed by a conductive and to a great extent transparent layer arranged in front of the display device.

The electrode arrangement may be arranged circumferentially on the edge around the display device, wherein the sensor electrode is formed by at least four sensor electrode segments separated from each other, which each time may be coupled with evaluation electronics, and in which each sensor electrode segment is arranged along an edge of the display device. In this way the X and the Y coordinate of an approaching finger may be determined.

There is also provided an apparatus for detecting gestures, the position and/or the approach of an object at a display device, with an electrode arrangement according to the invention, wherein the first shield electrode is embedded in a transparent protective material, which may be arranged in the display device, and wherein the first shield electrode serves to shield the electrode field of the sensor electrode from the grounded display device.

The first shield electrode and the at least one sensor electrode may be each embedded in a substrate and the substrate may be arranged in the surface opposite the display device of the transparent protective material. The substrate may be a transparent substrate.

The display device may be a touch-sensitive screen, wherein the first shield electrode is formed by the conductive structures of the touch-sensitive screen, wherein the conductive structures of the touch-sensitive screen are coupled by time division with an evaluation unit for contact detection and with an evaluation unit for approximation detection. In this way a screen may be provided which can detect both contact and approach or a gesture which is performed in front of the screen.

The apparatus may be adapted to evaluate, above a predetermined first distance of the object from the display device, a movement of the object relative to the display device.

The evaluation unit for approximation detection may be deactivated when the distance of the object from the display device is smaller than the first distance.

The apparatus may be adapted to evaluate, below a predetermined second distance of the object from the display device, a contact of the object with the display device.

Advantageously the second distance is greater than the first distance.

There is also provided a foil with a first side and a second side, whereby on the first side of the foil a sensor electrode or a plurality of sensor electrodes are arranged, on the first side at least one second shield electrode is arranged, and on the first side a conductor path for connecting the sensor electrode with evaluation electronics is arranged, wherein the second shield electrode is arranged between the conductor path and the sensor electrode. On the second side of the foil at least one first shield electrode is arranged.

Also a method is provided for the production of an proximity-sensitive display device with a touch-sensitive screen, in which the touch-sensitive screen comprises conductive structures for detecting a contact, comprising a step for applying a foil according to the invention on the touch-sensitive screen, wherein the at least one coupling electrode is orientated toward the screen and wherein the at least one coupling electrode may be brought into a capacitive coupling with the conductive structures of the touch-sensitive screen.

The foil connections and the conductive structures of the touch-sensitive screen are coupled with an evaluation unit for approximation detection, wherein the conductive structures are coupled by time division with the evaluation unit for approximation detection and with an evaluation unit for contact detection.

Further benefits and advantageous embodiments of the invention result from the description, the drawing, and the claims.

SHORT DESCRIPTION OF THE FIGURES

Figure 2:
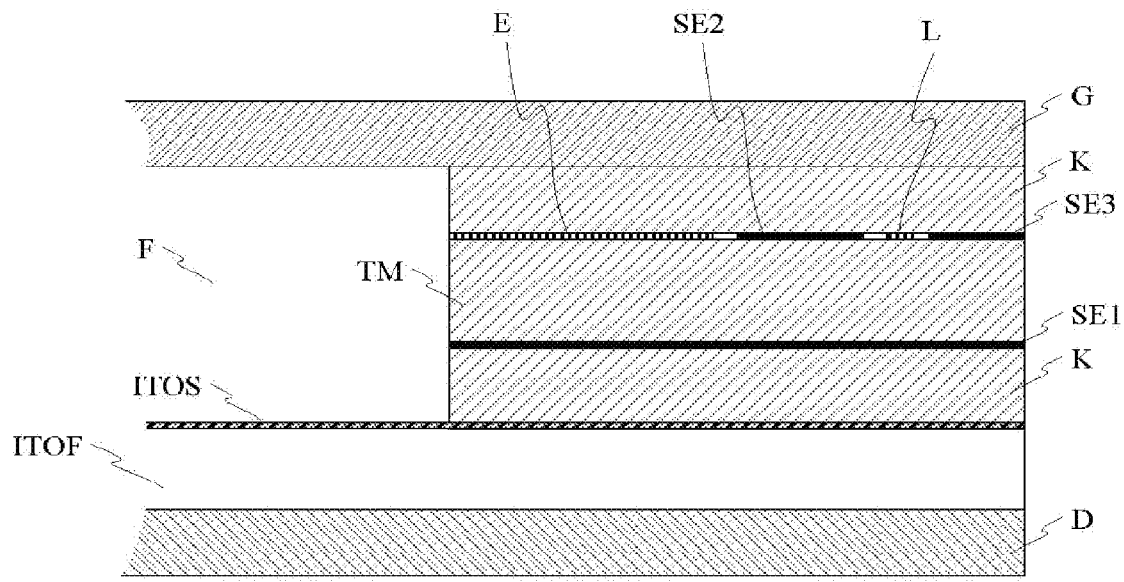
Figure 3:
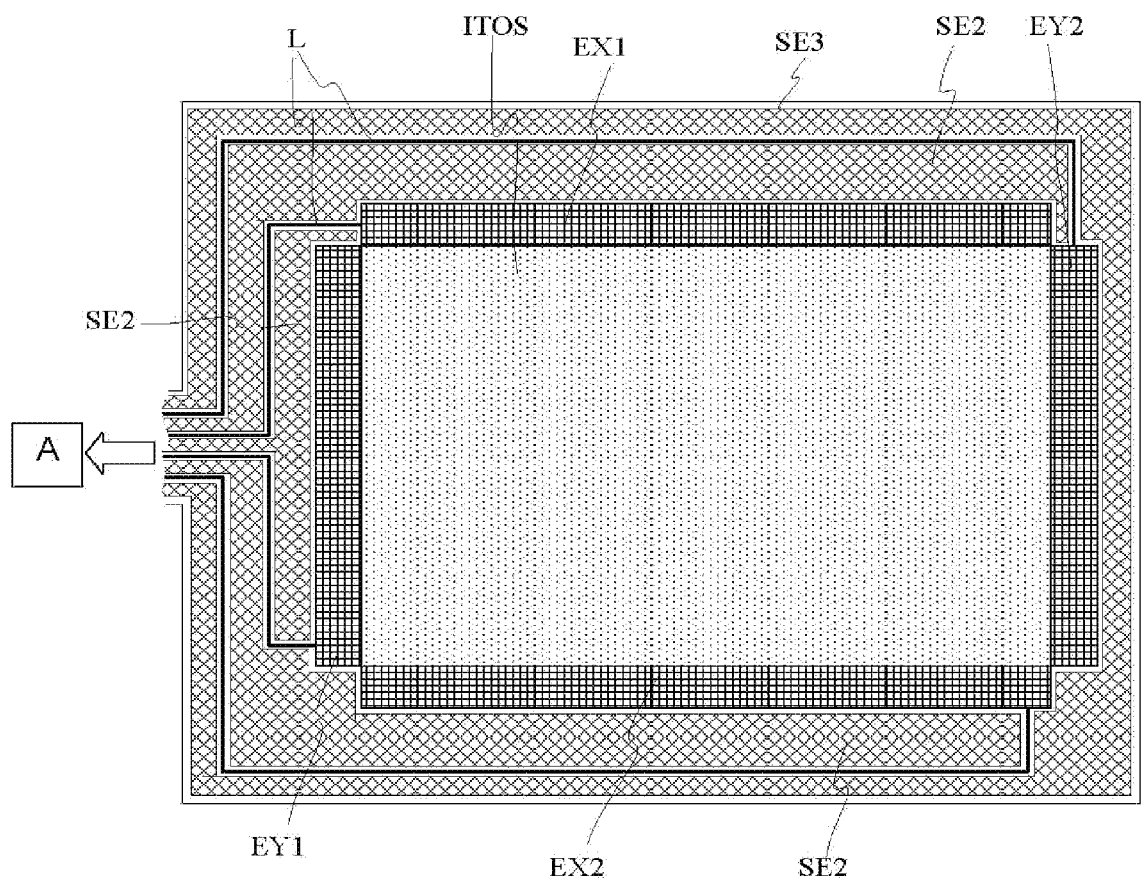
Figure 4:
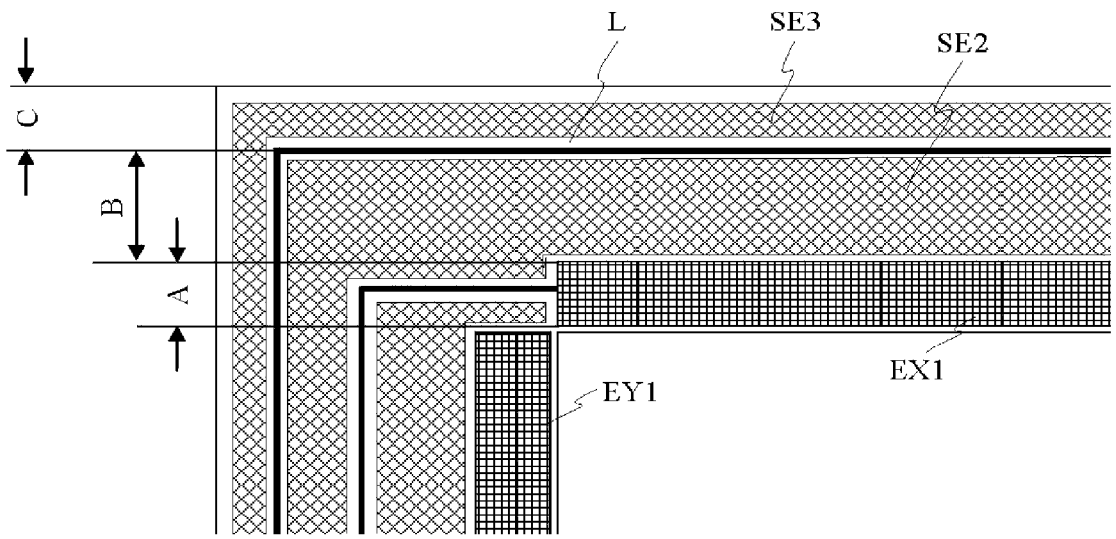
Figure 5:
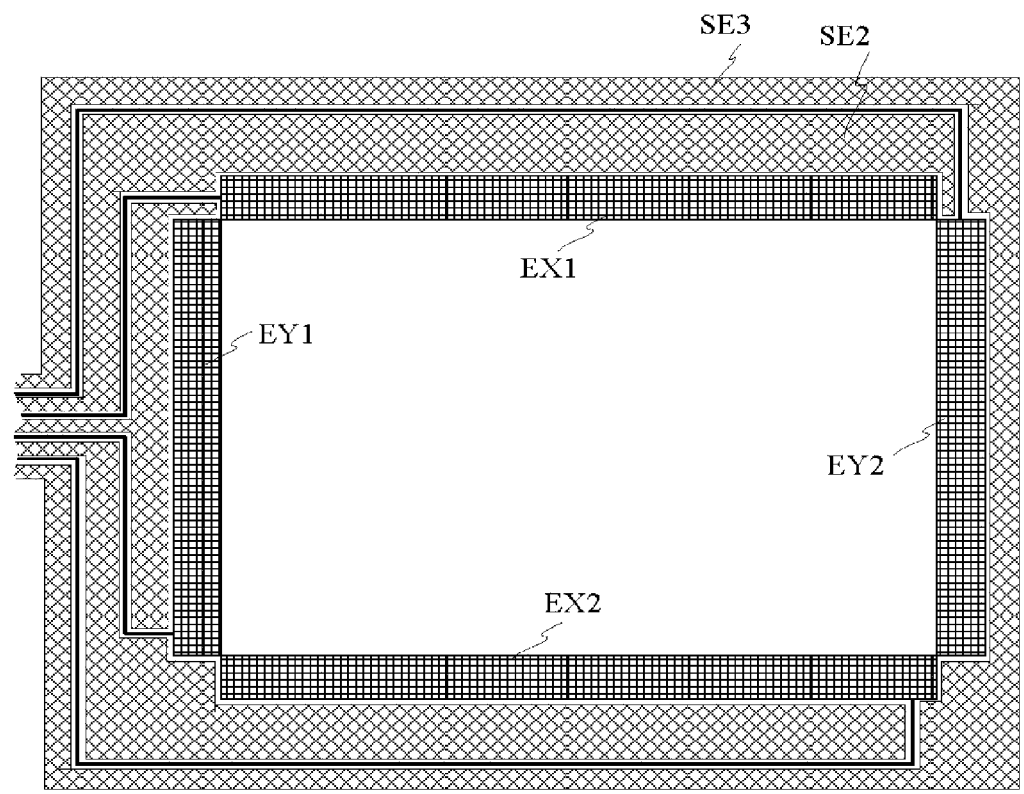
Figure 6:
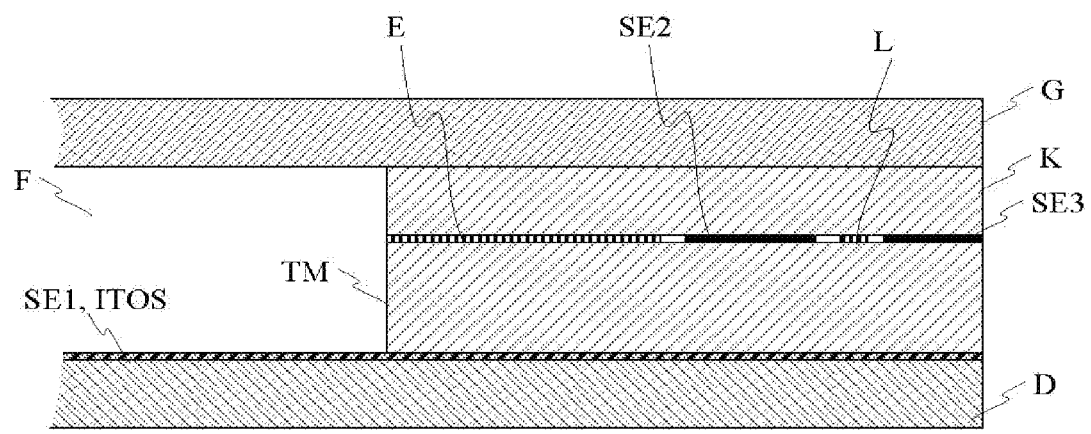
Figure 7:
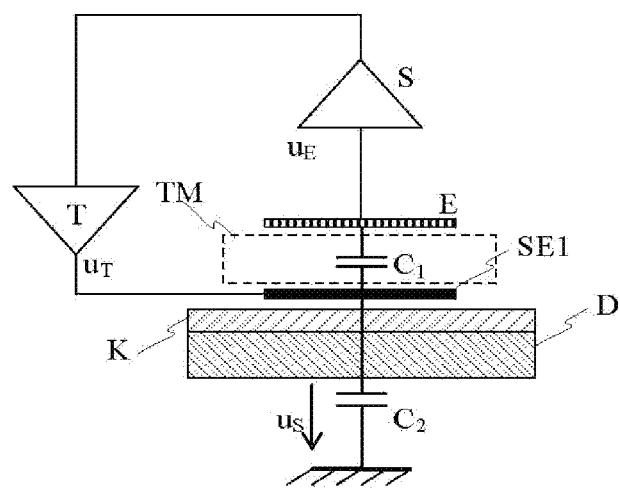
Figure 8:
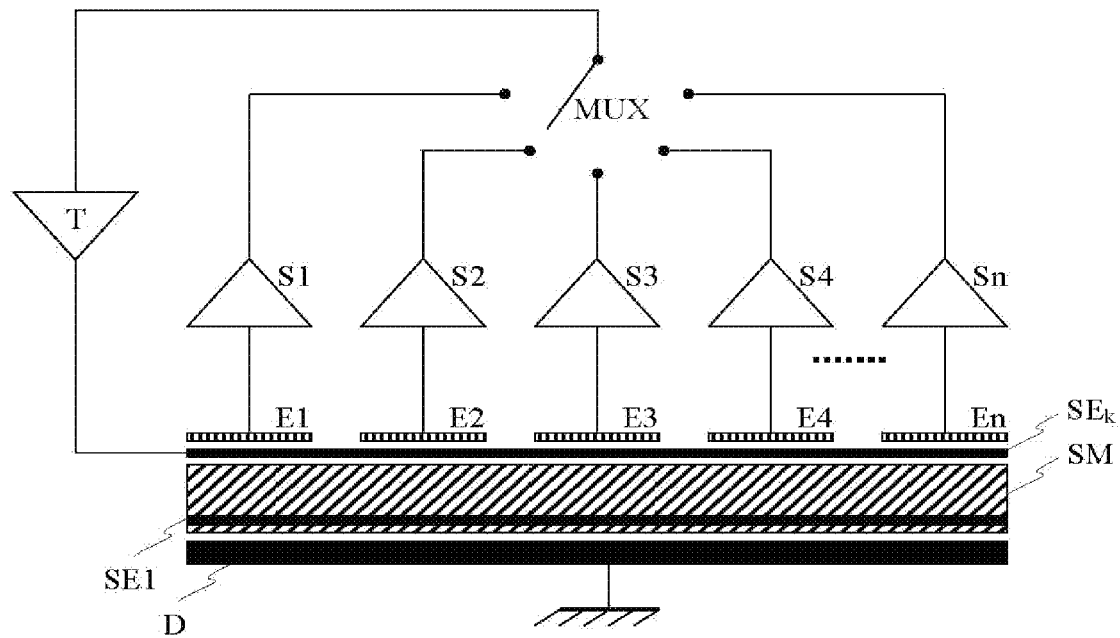
Figure 9:
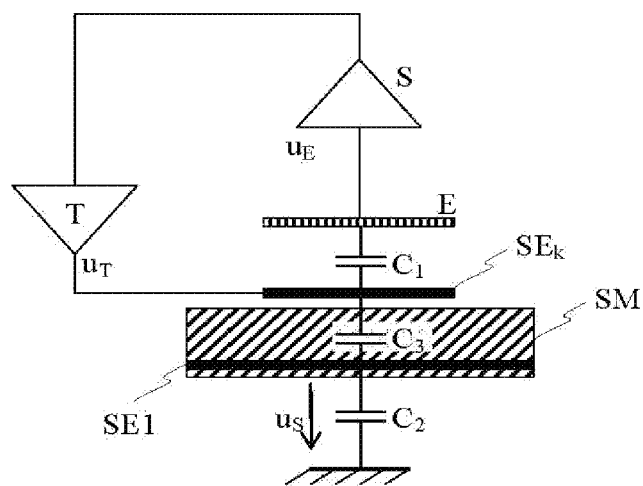
Figure 10:
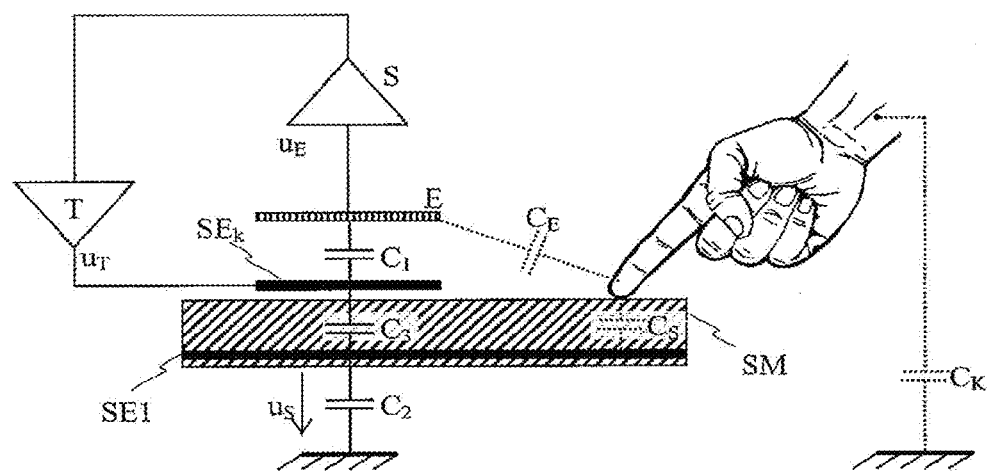
Figure 11:
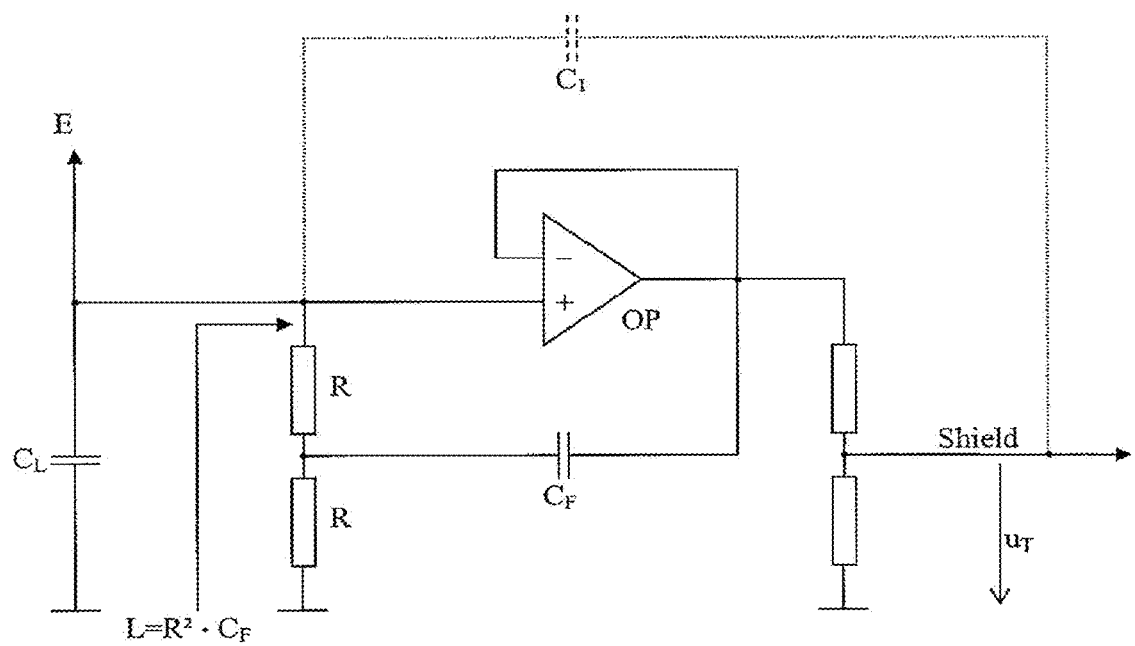
Figure 12:
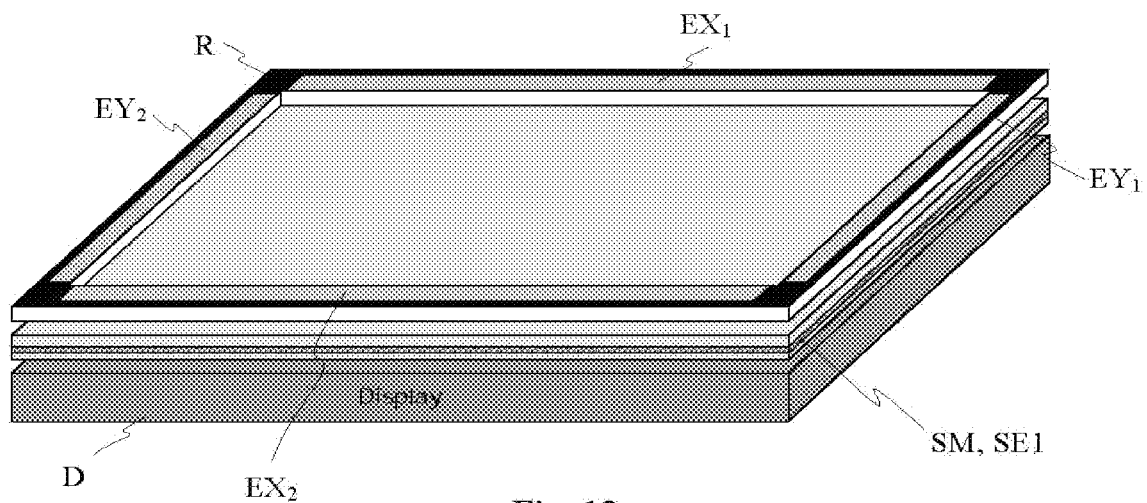
Figure 13:
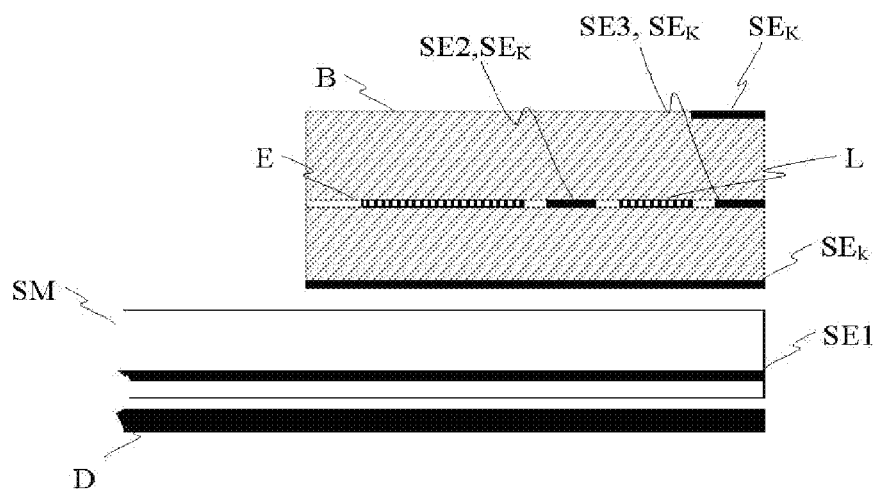
Figure 14:
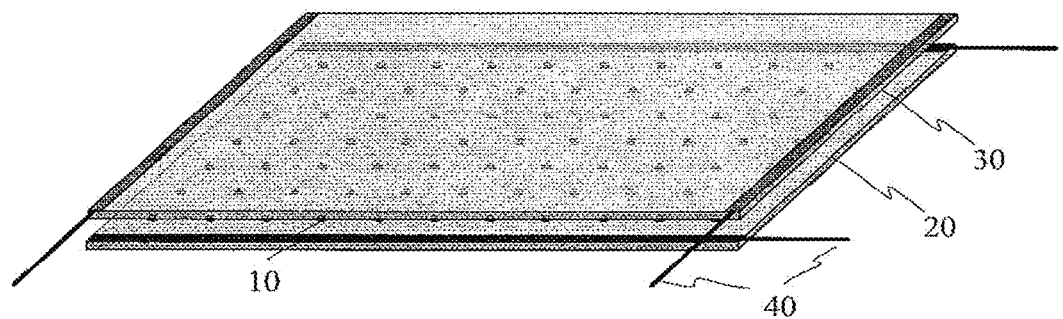
Figure 15:
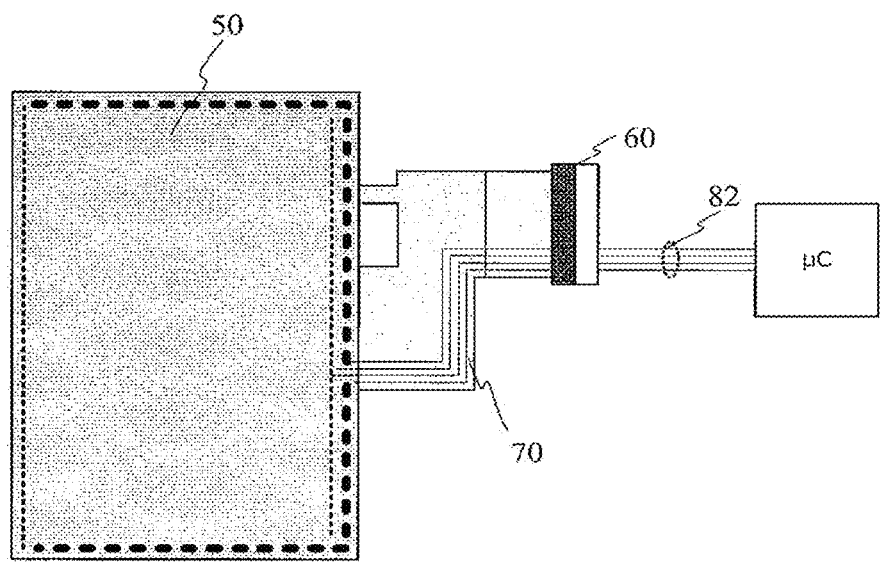
Figure 16:
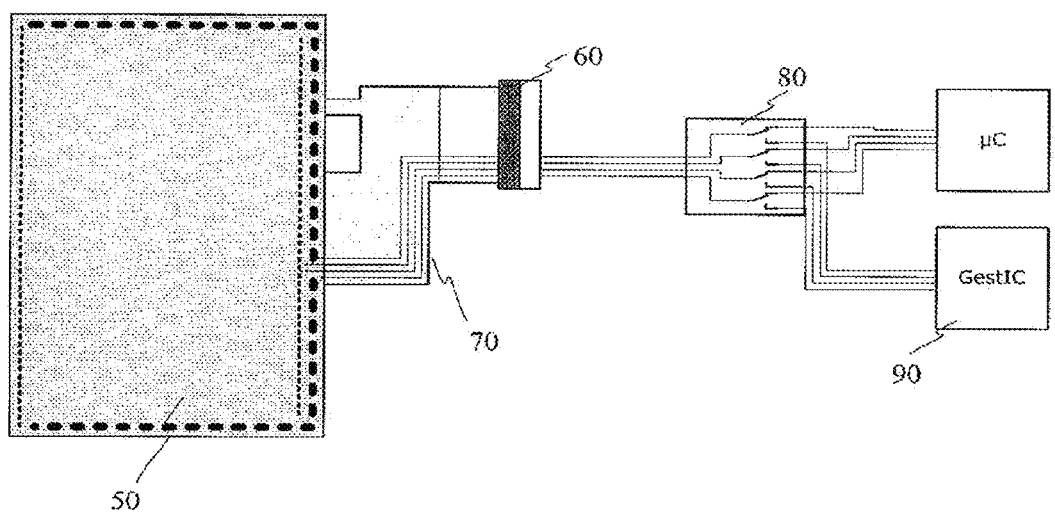
Figure 17:
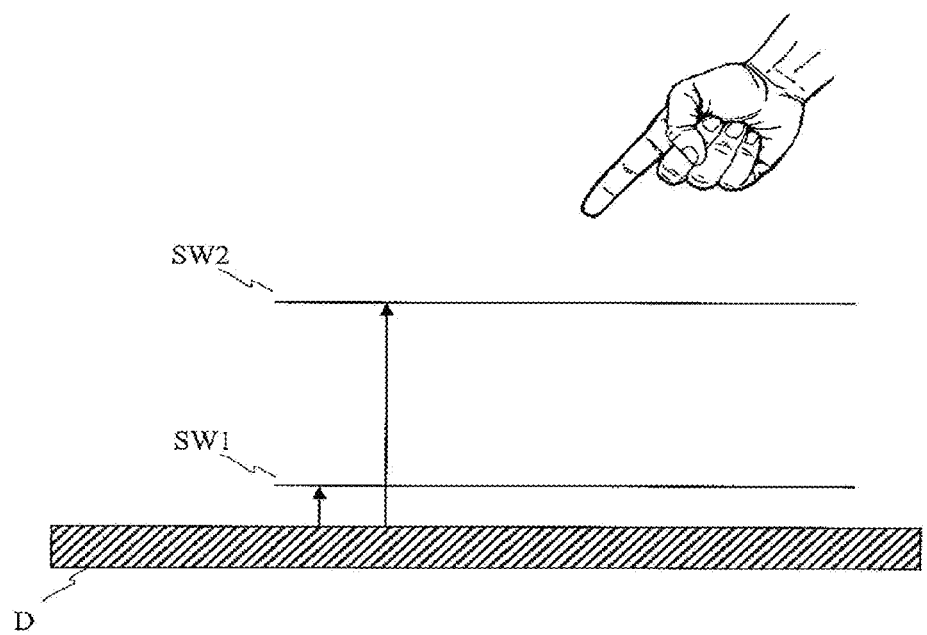
Figure 18:
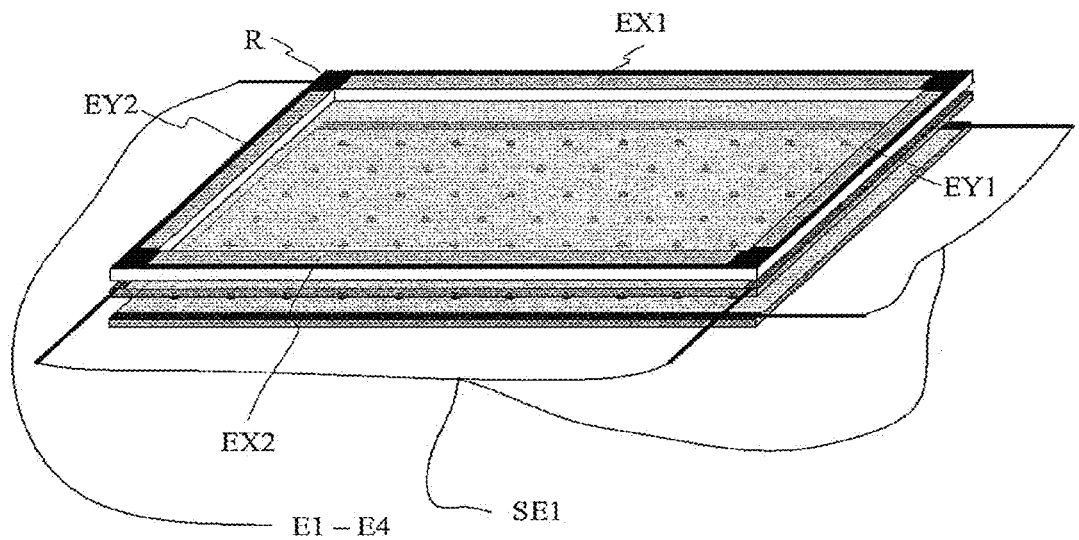
Figure 19:
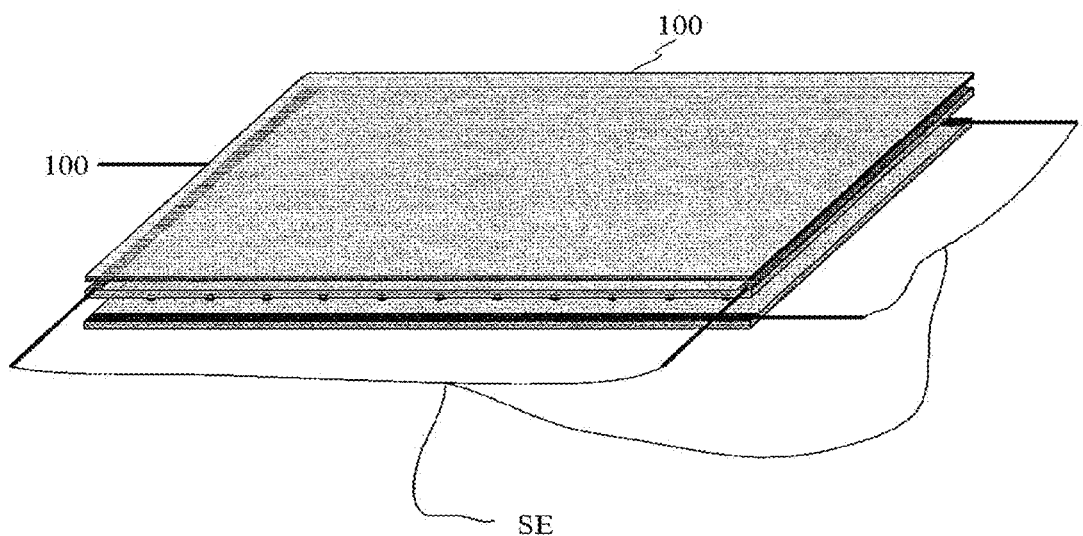

In the drawing embodiments are illustrated in a schematically simplified way and are explained more in detail in the following description. The figures show:

FIG. 1 a layer structure of an electrode arrangement according to the invention, with two electrode layers, wherein one electrode layer is DC coupled to a conductive layer of a display device;

FIG. 2 a layer structure of an electrode arrangement according to the invention with two layers, wherein one electrode is capacitive coupled to a conductive layer of a display device;

FIG. 3 an electrode configuration according to the invention for a display device in top view;

FIG. 4 a detail of the electrode configuration shown in FIG. 3;

FIG. 5 an electrode configuration according to the invention for small display devices, which do not have a conductive layer;

FIG. 6 another embodiment according to the invention of an electrode arrangement, wherein one electrode is formed by a conductive layer of a display device;

FIG. 7 a capacitive equivalent circuit diagram for a capacitive sensor with a sensor electrode and a shield electrode;

FIG. 8 a principle arrangement of a system according to the invention or of a circuit arrangement with several capacitive sensors;

FIG. 9 a capacitive equivalent circuit diagram for a is capacitive sensor of FIG. 8;

FIG. 10 a capacitive equivalent circuit diagram for a capacitive sensor with a finger approaching the capacitive sensor;

FIG. 11 an inductive component, designed as a gyrator, of the resonance circuit of a capacitive sensor;

FIG. 12 a frame form disposition of the electrodes of the system according to the invention;

FIG. 13 a layer structure of the frame form disposition shown in FIG. 12 of the electrodes of the system according to the invention;

FIG. 14 the basic structure of a resistive touch-sensitive screen;

FIG. 15 a circuitry of a touch-sensitive screen with an evaluation unit for contact detection;

FIG. 16 a circuitry according to the invention of a touch-sensitive screen with an evaluating device for contact detection and evaluation electronics for the proximity detection;

FIG. 17 an example for an approach and contact detection depending on the distance of an object from a touch-sensitive screen;

FIG. 18 the use of conductive structures of a touch-sensitive screen as shield electrodes for an electrode configuration according to the invention, wherein the electrodes are arranged in a frame form; and FIG. 19 the use of conductive structures of a touch-sensitive screen as shield electrodes for the system according to the invention, wherein the sensor electrode is formed as a conductive foil.

DETAILED DESCRIPTION OF THE INVENTION

FIG. 1 shows a layer structure according to the invention of an electrode arrangement for a capacitive sensor device or for a capacitive sensor for detecting a position and/or an approach of an object, for example of a hand or a finger. The electrode arrangement comprises at least one first shield electrode SE1, a second shield electrode SE2 and a sensor electrode E.

At the upper side of a substrate TM a sensor electrode E and a second shield electrode SE2 are arranged. On the second side of the substrate TM, i.e. on the bottom side of the substrate, a first shield electrode SE1 is arranged. A conductor path L, which couples the sensor electrode E with evaluation electronics A (cf. FIG. 3), is also arranged on the first side, i.e. on the upper side of the substrate TM. At the upper side of the substrate TM equally a third shield electrode SE3 is arranged. The disposition of the electrodes E, SE2 and SE3 arranged at the upper side of the substrate TM as well as that of the conductor path L is selected in such a way that the second shield electrode SE2 runs between the sensor electrode E and the conductor path L and the conductor path L runs between the second shield electrode SE2 and the third shield electrode SE3.

Any not electrically conductive material can be used as substrate TM. Preferably a foil is used as a substrate TM. In this way advantageously an electrode arrangement is provided, which consists of only two electrode layers, which in the end are separated from each other only by the substrate TM. The production of such a two-part electrode structure can be performed particularly cost-effectively. Moreover it is ensured, that the total electrode design inclusive the substrate TM can be particularly flat, which makes possible a particularly simple mechanic integration into the target system, for example a screen.

The first shield electrode SE1 arranged at the bottom of the substrate TM is DC-coupled with a conductive layer ITOS. If using the electrode arrangement according to the invention at a touch-sensitive screen, the electric conductive layer ITOS can be roughly the conductive coating in front of the visible area of the screen. The coupling of the conductive layer or the contact of the conductive layer with the first shield electrode SE1 can be produced for example by means of a feedthrough DK.

The electrode arrangement can be fixed for example with an adhesive K on a screen D. The fastening preferably takes place in such a way, that the sensor electrode E is assigned to the visible area of the screen or to the area to be supervised. On the side orientated toward the screen D for example a glass top G can be arranged, which for example is applied to the electrode structure according to the invention by means of an adhesive K. Between the glass top G and the conductive layer of the touch-sensitive screen a foil F can be provided for filling up, in order to avoid a parallax error. The conductive layer ITOS can be applied on a foil, like an ITO foil.

For the purpose of detection at the sensor electrode E an alternating electrical field is irradiated, a change of the irradiated alternating electric field being indicative for an approach or a position of an object at the screen. With the help of the second shield electrode SE2 the sensor electrode E is shielded against the conductor path L, so that the influence of the conductor path L on a measuring signal of the sensor electrode E is minimized. Advantageously the conductor path L is particularly thin if compared to the second shield electrode SE2, as will be explained more in detail in FIG. 4.

The third shield electrode SE3 is provided for eliminating or minimizing influences from the outside.

The first shield electrode SE1 arranged at the bottom of the substrate TM serves to shield the sensor electrode E against the screen, i.e. to shield the alternating electric field emitted by the sensor electrode E against the mass potential (of the screen). By the coupling of the first shield electrode SE1 with the conductive layer ITOS of the touch-sensitive screen moreover the total visible area of the screen is shielded from ground, so that an approach or a gesture detection also in the middle of the screen is still well detectable by the sensor electrodes E. This is especially advantageous in case of large display devices.

The electrically conductive layer ITOS of the screen is thus also used for reaching a shielding of the alternating electric field emitted by the sensor electrode E from ground, i.e. from the screen. In this way in a simple way a contact sensitive screen can be extended by the functionality of an approach or gesture detection, in which especially an approach or gesture detection also in the middle of the visible area of the screen is possible, without having to provide additional measures, like additional electrodes.

FIG. 2 shows a layer structure of an electrode arrangement according to the invention, as already has been shown and described in regard to FIG. 1. Unlike the embodiment of FIG. 1, in the embodiment according to FIG. 2 the conductive layer ITOS of the screen is not DC-coupled to the first shield electrode SE1, but capacitively. This has the advantage that the integration of the electrode arrangement according to the invention into an existing screen can be done particularly simply. In this way it is especially possible that the electrode arrangement, i.e. the substrate TM and the electrodes or conductor path arranged on the substrate at the upper side and at the bottom side in the visible edge zone of a touch-sensitive display can be glued with the help of an adhesive K. This is advantageously possible especially if the substrate TM and the electrodes arranged on the substrate and the conductor path consist of substantially transparent material.

FIG. 3 shows, in a top view, the electrode configuration for a touch-sensitive screen.

In this embodiment the sensor electrode E can consist of four electrode segments EX1, EX2, EY1, and EY2. Each electrode segment is connected, by means of a conductor path L, with evaluation electronics A. The electrode segments are arranged each time on the edge of the display device, i.e. the electrode segments EY1 and EY2 are arranged at the left edge or at the right edge of the screen and the electrode segments EX1 and EX2 are arranged at the upper edge or at the lower edge of the screen. In this way it is possible advantageously to detect not only the approach of a finger or a hand to a display device, but also the position of the finger or the hand relatively to the display device.

As can be seen clearly in FIG. 3, between the conducting paths L and the electrode segments each one shield electrode SE2 is arranged, which shields the alternating electric field emitted by the respective electrode segments against the conducting paths L. The embodiment of FIG. 3 shows a touch-sensitive screen in which in front of the visible area of the screen a conductive coating is present, with which a contact with the screen can be detected.

For example it can be a resistive touchscreen. As already explained in regard to FIG. 1, the conductive coating of the screen is DC-coupled or capacitively coupled with the first shield electrode SE1. As shown in FIG. 6, the conductive coating of the touch-sensitive screen at the same time can also form the first shield electrode SE1, so that an altogether even flatter structure of an electrode arrangement is possible, in order to expand a contact sensitive display by the functionality of an approach or gesture detection.

In FIG. 4 a detail of the electrode configuration shown in FIG. 3 is illustrated. In regard to FIG. 4 in the following the dimensioning of the electrodes or the conducting paths is typically explained.

The type of the conducting paths L for connecting the electrodes to the evaluation electronics is quite important. Especially a small conductor path width is advantageous, in order to delimit the sensitivity of the electrode arrangement in the best possible way spatially to the electrode surfaces.

The second shield electrode SE2 is broad compared to the width of the conductor path L. In this way the sensor electrode is shielded in the best possible way against the conductor path L.

In order to obtain a highest possible sensitivity of the whole sensor system, also the width A of the sensor electrode is selected as large as possible. The influence of the conductor path L on the sensor electrode can still be further reduced by selecting the distance B of the conductor path L from the sensor electrode as large as possible. The widths of the sensor electrode EX1 or the shield electrode SE2 can vary, as long as the width of the shield electrode SE2 is greater than the width of the conductor path L. A particularly advantageous configuration of the electrodes and the conductor path L is reached if the conductor path L, as visible in FIG. 4, in relation to both the shield electrode SE2 and to the sensor electrode EX1 is particularly thin.

A particularly advantageous configuration is ensured if the widths of the second shield electrode SE2 and the sensor electrode are selected extra large compared to the width of the conductor path L and at the same time the width of the sensor electrode is of the same size or is greater than the width of the second shield electrode SE2. In this way on the one hand a good shielding of the sensor electrode against the conductor path L and on the other hand a good sensitivity of the sensor electrode is reached.

Depending on the material surrounding the electrodes it is also possible to design the second shield electrode SE2 slightly larger than the sensor electrode; here too the conductor path L should be particularly thin.

FIG. 5 shows an electrode configuration according to the invention for a display device. The electrode configuration shown in FIG. 5 is especially suitable for small display devices, as the width of the four electrode segments EX1, EX2, EY1, and EY2 or the surfaces of the four electrode segments can be selected in such a way that also in the middle of the screen an approach or a gesture can be safely detected. A conductive coating of the screen is not necessary. In this way it is possible for example to extend an electronic picture frame by an approach or gesture detection possibility. Another application of the electrode configuration shown in FIG. 5 is for example the arrangement of the electrode configuration on a display of a navigation instrument. In this embodiment it is advantageous to design the electrode segments as broad as possible, in order to allow a good detection also in the middle of the screen.

FIG. 6 shows the layer structure of an electrode arrangement according to the invention, as it for example can be used in display devices which have no conductive coating. With this arrangement or with this configuration also the sensitivity of smaller screens, as described referring to FIG. 5, can be even further increased. Especially with this configuration also extensive display devices can be extended by an approach or gesture detection possibility, in which also in case of extensive display devices a detection in the area of the center of the display device is guaranteed.

At the upper side of the substrate TM, as already shown in regard to FIG. 1 and FIG. 2, a sensor electrode E, a second shield electrode SE2, the conductor path L, and a third shield electrode SE3 are arranged. At the bottom of the substrate TM a conductive layer ITOS is arranged, which on one side of the substrate protrudes beyond the substrate, thus protrudes into the visible area of a display device or completely covers the visible area of the display device.

The conductive layer ITOS is preferably formed as a transparent layer, as it for example is used in touch-sensitive displays. The conductive layer ITOS here assumes the function of the first shield electrode SE1 shown in the FIGS. 1 and 2. In this way a foil is practicable which can be glued for example on a display device, wherein the electrodes E, SE2, SE3, and the conductor path L are arranged on the edge of the foil, as it is shown for example in regard to FIG. 3. Thus also in case of display devices which have no conductive coating the alternating electric field emitted at the sensor electrode E can be shielded against the mass of the display device.

FIG. 7 shows a capacitive equivalent circuit of a capacitive sensor according to the invention with a sensor electrode E and a first shield electrode SE1.

Between a sensor electrode E and the first shield electrode SE1 a capacitance $C_1$ is active. The first shield electrode SE1 presents a capacitance $C_2$ opposite the grounded screen D.

The screening effect by the first shield electrode SE1 is ensured by switching the driver T on the first shield electrode SE1. If the output voltage $u_T$ of the driver T roughly corresponds to the electrode voltage $u_E$ at the sensor electrode E, a particularly good screening effect results.

The represented capacitive sensor S (also several sensors may be provided) can work according to a phase method, wherein the phase shift of a resonance circuit of the capacitive sensor compared to a reference signal of a generator of the capacitive sensor is indicative for the approach. In case of approach of a finger to a sensor electrode E of a capacitive sensor S, the resonance circuit, due to the capacitance change of the capacitive sensor, is tuned out of the originally adjusted resonance. This results in an amplitude and phase change of the signal of the resonance circuit with respect to the generator signal applied on the resonance circuit.

Amplitude and phase change can be used for detecting an approach to the capacitive sensor S or to its sensor electrode E. Most advantageously however the phasing is exploited, because with it one remains to a great extent independent of possible amplitude variations of the generator signal and moreover reaches a larger sensitivity as for capacitance variations of the sensor electrode E. Moreover if using the phase method the voltage at the resonance circuit can be maintained low, which has an advantageous effect on the field emission at the sensor electrode E and thus also reduces the EMC problem as to the emission of radiation. Moreover a phase method is also more insensible against interferences from the is outside on the receiving end.

The necessary inductive component for a resonance circuit of a capacitive sensor S can be realized by means of a gyrator. The basic structure of a gyrator for a capacitive sensor in a system according to the invention is illustrated in FIG. 11.

FIG. 8 shows a principle arrangement of a system according to the invention or of a circuit arrangement according to the invention.

The arrangement comprises sensor electrodes E1 to En, which are each time coupled with a respective capacitive sensor S1 to Sn. Over the screen or display D a transparent protective material SM is arranged. The protective material SM can be either made from glass or a foil of plastic material. Other materials suitable for this purpose can also be used.

At the bottom side or the upper side (or just below a surface) of the glass or the foil a poorly conductive layer is applied that serves as shield electrode SE1 for shielding the electric field emitted by the sensor electrodes S1 to Sn from the grounded screen D. This conductive layer acts as a shield or as shield electrode SE1 against the grounded screen D each time when the electrode voltage applied at the sensor electrodes E1 to En is roughly equal to the voltage applied at the shield electrode SE1.

The shield electrode SE1 and the sensor electrodes E1 to En then have about the same potential, so that the space between the shield electrode SE1 and the sensor electrodes E1 to En is almost field-free.

The shield electrode SE1 can be part of the display arrangement or of the screen D, whereas the sensor electrodes E1 to En can be applied on the screen D independently of the shield electrode SE1 or can be applied subsequently.

In order to guarantee also in case of an attachment of the sensor electrodes E1 to En independent of the shield electrode SE1 that they substantially have the same potential or that between them a substantially field-free space is formed, each time one of the sensor outputs of the capacitive sensors S1 to Sn by means of a multiplexer MUX and a driver circuit T is switched on a coupling electrode $SE_K$.

The coupling electrode $SE_K$ is arranged in such a way, that it lies between the sensor electrodes E1 to En and the shield electrode SE1 and preferably can be brought in capacitative coupling with the shield electrode SE1. In another embodiment not shown here the shield electrode SE1 can be DC-coupled with the coupling electrode $SE_K$.

The driver circuit T is designed to drive the current of the coupling electrode $SE_K$ and to charge the coupling electrode $SE_K$ with a voltage which is in phase to the electrode voltage applied at the sensor electrodes E1 to En. The signal generated in such a way at the coupling electrode $SE_K$ is coupled capacitively over the glass or the foil onto the electrically conductive layer or onto the shield electrode SE1. Thus it is guaranteed that in any case a substantially field-free space develops between the sensor electrodes E1 to En and the shield electrode SE1.

The capacitative coupling from the upper side of the glass or the foil is from the point of view of an economic production particularly advantageous, as the total configuration of sensor electrodes E1 to En and coupling electrode $SE_K$ for coupling to the shield electrode SE1 can be simply put on the screen D from above. This is important above all also from the point of view of the upgrade of screens with an approach functionality.

The functioning mode of the electric circuit shown in FIG. 8 is explained more in detail in FIG. 9.

FIG. 9 shows a capacitive equivalent circuit of the circuit shown in FIG. 8 for a capacitive sensor S.

Between a sensor electrode E and the coupling electrode $SE_K$ a capacitance $C_1$ is active. Another capacitance $C_3$ between the coupling electrode $SE_K$ and the conductive layer or shield electrode SE1 serving for shielding is formed in the glass or in the foil SM. The shield electrode SE1 presents a capacitance $C_2$ as to the grounded screen D.

For the screening effect of the shield electrode SE1 the voltage present at the shield electrode SE1 $u_S$ is decisive. With an output voltage $u_T$ at the driver T the voltage $u_S$ results from $$u_S = u_T/(1+C_2/C_3)$$

As the output voltage $u_T$ of the driver T roughly corresponds to the electrode voltage $u_E$ at the sensor electrode E, a better screening effect results, the smaller the ratio $C_2/C_3$ is. This can be reached by design features, for example by selecting suitable distances between the sensor electrodes E and the shield electrode SE1. It has been found out that even with a ratio of 1 for $C_2/C_3$ a high screening effect is obtained.

From FIG. 9 it is also visible that over the coupling capacitance $C_1$ between sensor electrode E and coupling electrode $SE_K$ a feedback occurs in the sensor circuit, as by means of the driver circuit T toward the sensor S a loop is formed. This effect can be exploited advantageously for an increase of the sensor sensitivity.

The use of a conductive layer or a shield electrode SE1 in the glass or on a foil SM moreover offers the possibility to realize, with the system according to the invention according to FIG. 8, apart from an approximation detection, also a contact detection that either independently of the place of the contact for example makes possible a switching function or depending on the place of the contact on the screen can be used for a calculation of the coordinates of the finger position. Particularly advantageously with the system shown in FIG. 8 a gesture detection can be realized. The contact detection is explained more in detail in regard to FIG. 10.

FIG. 10 shows a capacitive equivalent circuit for a capacitive sensor with a finger approaching the capacitive sensor or with a finger touching the display.

The contact with the glass SM or the foil always entails an abrupt or very fast reduction of the voltage $u_S$ at the shield electrode SE1, as the shield electrode SE1 over a coupling capacity $C_S$ starting from the finger and over the body capacitance $C_K$ to ground is additionally capacitively charged. This reduction of the voltage $u_S$ means an increase of the load capacitance active at a sensor electrode E. Correspondingly also the signal voltage $U_F$ of the sensor changes abruptly or very fast. At the same time a contact of the screen also entails a capacitive coupling toward the sensor electrode E illustrated in FIG. 10 with a further coupling capacitance $C_E$. If one approaches the sensor electrode E simultaneously touching the display, this gives an additional change of the signal voltage of the sensor S, by which also the distance of the finger from sensor electrode E can be determined.

In association with the remaining sensor electrodes in this way the coordinate of the finger on the screen can be determined. This is possible however with sufficient precision only if the coupling $C_S$ of the finger as to the shield electrode SE1 if compared to the coupling $C_E$ of the finger on the sensor electrode E does not prevail too much.

This can be reached by a corresponding design of the electrode configuration, by arranging the shield electrode SE1 more closely to or further away from the surface opposite to the screen of the glass SM or the foil. If the shield electrode SE1 is arranged further away from the surface to be touched of the glass or the foil SM, according to the invention one obtains the possibility of a distinguishable contact on the screen. The precise electrode configuration depends each time on the size of the screen.

FIG. 11 shows the basic structure of a gyrator for a capacitive sensor in a system according to the invention.

An operational amplifier OP fed back by a capacitor $C_F$ acts at the input as a virtual inductance $L = R^2 \cdot C_F$, which constitutes, together with the sensor electrode E connected there and its load capacitance CL, a parallel resonant circuit against ground and acts in this way as a sensitive element as to the described phase shift. At the same time the output of the operational amplifier OP serves to drive the coupling electrode $SE_K$ or the shield electrode SE1, which as said is capacitively coupled with the coupling electrode $SE_K$, connected over the multiplexer MUX of FIG. 8.

As over the capacitance $C_1$ between the sensor electrode E and the coupling electrode $SE_K$ of FIG. 9 a feedback loop arises, and thus the arrangement would tend to oscillate, by means of an attenuator formed preferably as an ohmic voltage divider the output voltage of the operational amplifier OP is divided down, so that the ratio between the output voltage of the operational amplifier OP and the voltage $u_T$ at the coupling electrode $SE_K$ is smaller than one. In this way a stable operation is guaranteed. Additionally the output of the operational amplifier OP can be coupled with the driver circuit T, in order to optionally increase the voltage again, with which the coupling electrode $SE_K$ is supplied, and in order to free the coupling electrode $SE_K$ from a capacitive load.

If using the gyrator shown in FIG. 11 as an inductive component of the resonance circuit of a capacitive sensor S, in one embodiment of the system according to the invention according to FIG. 8 or FIG. 9 this can be realized also without driver circuit T, since the ohmic voltage divider itself acts as an amplifier with an amplification factor smaller than 1 and drives the coupling electrode $SE_K$.

This arrangement has moreover the advantage to undamp, by means of this feedback, the oscillation circuit, and thus to reach a high factor of quality, which in turn guarantees a high approach sensitivity. This simple and economic electronic realization of a parallel resonant circuit makes also possible an integration of the whole system into an ASIC.

According to the principle arrangement shown in FIG. 8 of a system according to the invention with several capacitive sensors according to the invention any electrode configurations can be realized consisting of sensor electrodes, coupling electrodes and shield electrodes, in order to detect an approach or a movement (e.g. a gesticulation) in the area of the sensor electrodes.

An example for an arrangement consisting of four line-form electrodes $EX_1$, $EX_2$, $EY_1$, $EY_2$ in a multilayer structure is shown in FIG. 12. FIG. 12 shows a frame-form arrangement R, which can be put from above on a display D for the upgrade for an approach functionality (or gesticulation function). The stripe-shaped electrodes $EX_1$, $EX_2$, $EY_1$, $EY_2$ are arranged along the four outer edges of the frame R.

The layer structure of the frame-form arrangement shown in FIG. 12, which can be realized e.g. with several foils one upon another, is illustrated schematically in FIG. 13.

The sensor electrode E and several coupling electrodes $SE_K$ are embedded in a substrate B. The substrate can be for example a foil, which can be transparent. The coupling electrodes $SE_K$ are DC-coupled to each other and are driven by the same driver circuit T.

The coupling electrode arranged on the edge at the upper side of the substrate makes possible a screening effect outward toward the edge zone of the display D. The coupling electrode arranged at the bottom of the substrate, together with the shield electrode SE1 sunk into the glass or the foil SM, serves to shield the sensor electrode E against the display.

The stripe-shaped arrangement has the advantage, that the coordinates of the position of a finger can be calculated with a simple algorithm for an X/Y coordinate system on the display surface, as e.g. the signals which arise at the X electrodes $EX_1$ and $EX_2$ are independent of the signals at the Y electrodes $EY_1$ and $EY_2$.

A calculation of the coordinates with four stripe-shaped sensor electrodes can take place for example on the basis of an evaluation of the phasing ΦX or ΦY of the X electrodes or the Y electrodes. To this advantageously the phase difference and the phase sum of the X or Y electrode pairs are determined, thus $$\Delta\Phi_X = \Phi_{X1} - \Phi_{X2} \text{ and } \Sigma\Phi_X = \Phi_{X1} + \Phi_{X2}$$

or $$\Delta\Phi_Y = \Phi_{Y1} - \Phi_{Y2} \text{ and } \Sigma\Phi_Y = \Phi_{Y1} + \Phi_{Y2}.$$

In this way also a linearization of the determination of the coordinates is possible, as in the difference formation in general a non-linear course of the phase difference results. For the linearization at first (for each electrode pair) a function $$\Psi_X = \Sigma\Phi_x - \Phi_{X0}$$

$$\Psi_Y = \Sigma\Phi_Y - \Phi_{Y0}$$

can be defined. From this $$\Delta\Phi_X / \Psi_x = (\Phi_{X1} - \Phi_{X2})/(\Phi_{X1} - \Phi_{X2})/(\Phi_{X1} + \Phi_{X2} - \Phi_{X0}$$

$$\Delta\Phi_Y / \Psi_Y = (\Phi_{Y1} - \Phi_{Y2})/(\Phi_{Y1} - \Phi_{Y2})/(\Phi_{Y1} + \Phi_{Y2} - \Phi_{Y0}$$

can be selected with a suitably selected constant $\Phi_{X0}$ or $\Phi_{Y0}$, in order to obtain the linearization each time in X direction and Y direction. By the approximative proportionality resulting from this the position of a finger can be determined very simply.

With the frame-form structure shown in FIG. 12 and FIG. 13, which consists of the layer SM with the shield electrode SE1 and the layer B with the sensor electrodes and the coupling electrodes $SE_K$, in a very simple way a consisting display can be extended by the functionality of an approach determination or gesture determination.

Equally according to the invention the system can be integrated into an existing display, by using electrically conductive structures already present in the display also for the system according to the invention.

Thus for example resistive touch-sensitive displays can be extended in a simple way by the mentioned functionality, by using the already present conductive structures of the touch-sensitive display.

FIG. 14 shows the structure of a resistive touch-sensitive display (touchscreen). The resistive touch-sensitive display substantially consists of two opposite conductive layers 20, 30 (foil-foil or ITO glass-foil), which are separated from each other by small spacer dots 10. The touch-sensitive display is arranged above the display device. The touch-sensitive display has measuring lines 40, which are under voltage over the point of contact in case of a contact with the finger or stylus.

FIG. 15 shows the coupling of the resistive touch-sensitive display 50 shown in FIG. 14 by means of display connection cables 70 and a plug 60 with an evaluation unit μC for detecting touches.

According to the invention the conductive layers of a touchscreen (independently of the concrete touchscreen type) can be used as electrode structures, especially as first shield electrode SE1 for the electrode arrangement according to the invention. In order to maintain the present function of the contact detection of the touchscreen, the present function of the contact detection is coupled by time division 80 with an evaluation unit 90 according to the invention GestIC for proximity detection. Such a coupling is shown in FIG. 16.

FIG. 17 shows an example for an approach and contact detection depending on the distance of an object from a touch-sensitive screen.

In the example shown here two switching thresholds SW1 and SW2 are defined. The switching thresholds indicate a first distance SW1 and a second distance SW2 from the touch-sensitive screen D.

A human hand or finger approaching the touch-sensitive screen D can carry out movements in front of the touch-sensitive screen D or in the area detected by the electrode arrangement according to the invention, which are detected and can be evaluated by the electrode arrangement. The evaluation can include a gesture detection.

If the distance of the hand or the finger from the screen D is greater than the second distance SW2, the evaluation unit μC for detecting touches is deactivated. The evaluation unit GestIC for proximity detection is activated in order to detect movements in front of the screen.

If the hand or the finger further approaches the screen, so that the distance of the hand/of the finger is smaller than the second distance SW2 and greater than the first distance SW1, the evaluation unit μC and the evaluation unit GestIC are activated. In this way on the one hand movements or gestures can be detected. On the other hand it is also ensured that a fast approach to the screen or a fast touch of the screen is reliably detected by the evaluation unit μC.

If the hand or the finger approaches even further the screen D, so that the distance of the hand/of the finger is smaller than the first distance SW1, the evaluation unit GestIC is deactivated. The evaluation unit μC for detecting touches remains activated. In this way it can be prevented that movements very near in front of the screen, which lead to a touch of the screen, are included in the evaluation of the movement. The distance SW1 can be selected very small. Preferably the distance SW1 is some millimeters. Depending on the field of application the distance SW1 however can also be some centimeters.

In the example shown here the evaluation unit μC for detecting touches and the evaluation unit GestIC for proximity detection are activated or deactivated in order to provide or not provide the corresponding functionality. The activation of the evaluation units μC or GestIC can be done for example by supplying them with the corresponding operating voltage.

As an alternative to activating or deactivating the evaluation unit GestIC it can be adapted also in such a way that it executes the corresponding functionality each time only depending on the distance of the object from the screen. The evaluation unit GestIC then evaluates the detected movements only if the distance of the finger is greater than the first distance SW1. If the distance is smaller than the first distance SW1, the movements are detected, but not evaluated. It is particularly advantageous, if in case of a distance smaller than SW1 only the movement along the Z axis, thus the distance of the finger from the screen, is evaluated.

The evaluation units GestIC and μC are always active, and are coupled as shown in FIG. 16 with the corresponding electrodes.

According to the invention there are several possibilities of realization, in which always at least one conductive layer of the touch-sensitive display is used either as sensor electrode E or as shield electrode.

A first possibility consists in using the lower layer 20 orientated toward the screen D as shield electrode and the upper layer 30 as sensor electrode E. In this way a resistive touch-sensitive display can be upgraded without additional electrodes. The shield electrode at the same time also is the coupling electrode $SE_K$.

Another possibility shown in FIG. 18 consists in using two conductive layers of a resistive touch-sensitive display jointly as a common first shield electrode. Alternatively only one of the two conductive layers can be used as first shield electrode. The sensor electrodes necessary for the structure $EX_1$, $EX_2$, $EY_1$, $EY_2$ can be arranged as a separate part on the screen. Here a type can be used as frame structure, in which on the frame structure only the sensor electrodes, the second shield electrodes and the conducting paths are arranged. Also a single surrounding sensor electrode can be arranged, with which a simple approach to the display without determination of the position is made possible. The frame structure can be DC-coupled with the evaluation unit for example by means of press or clip contacting.

Another possibility consists in using at least one conductive layer of the resistive touch-sensitive display as shield electrode and designing the sensor electrode E in the form of an additional conductive foil 100 (e.g. ITO foil) and apply it on the existing touchscreen, as shown in FIG. 19. In the embodiment shown in FIG. 19 only one sensor electrode E is applied as a continuously conductive foil on the touchscreen. In this way it is possible in a simple way, to realize a simple approach to the display without determination of the position.

Alternatively a foil with several sensor electrodes independent from each other E or a foil with segmented sensor electrodes E, for example with 4 or 16 square or rectangular sensor electrodes, can be applied on the touchscreen. Also several parallel stripe-shaped formed sensor electrodes are possible, so that advantageously for example the X position of the approaching finger can be detected. With a rising number of the sensor electrodes the solution of the detection, for example of a gesture, can be further increased.

This has the advantage that at least one electrode surface of the system according to the invention can be done without, nevertheless the full functionality of the approach or gesture detection can be provided by using the conductive structures of the touchscreen with a better sensitivity than in systems of prior art. In this way also a much simpler mechanical integration results, which means a considerable cost reduction in the process of manufacture as well as in material expenses.

By the invention it becomes advantageously possible to trigger for example functions of the device without touching the instrument. Thus for example functions of a navigation instrument can be called up in a motor vehicle without averting the look from the traffic, which increases safety in traffic. A switch or a button on a touchscreen of the navigation instrument can nevertheless be operated.

By the operation without contact it is also possible for example to handle an electronic picture frame without polluting it by fingerprints. The aesthetic general impression of this instrument is unaffected also in intense use. Handling an electronic picture frame can include for example switching-over pictures to be visualized. Moreover the arrangement of an electronic picture frame or its installation can take place without taking into account that when touching or switching a control element it might get out of place or fall from the wall. The electronic picture frame can thus be applied also in areas, in which the user has no direct access to control elements applied at the back side of the instrument, as it is the case with known electronic picture frames. The user only needs to be able to arrive in the proximity of the device in order to handle or command it with gestures.

The invention is characterized by a high flexibility especially in the adjustment to different screen sizes, without the sensitivity decreasing in case of greater displays. In further embodiments not shown here also several electrode segments can be provided in order to detect also complicated gestures. As the electrode arrangement consists of only two electrode layers, i.e. the electrodes and the conductor path at the upper side of the substrate and the electrode at the bottom of the substrate, a particularly simple mechanical integration into the target system is possible, as the total electrode arrangement can be particularly flat. Moreover the production of a two-layer electrode configuration on a substrate, as proposed by the invention, is practicable in a particularly simple and cost-effective way. By furnishing a conductive foil, on which the substrate TM and the electrodes are applied, moreover various display devices can be extended by a gestures or approach functionality.

The invention claimed is:

1. An electrode arrangement for a capacitive sensor for detecting a position or an approach of an object, the electrode arrangement comprising a substantially flat substrate having a first side and a second side; a sensor electrode arranged on the first side of the substantially flat substrate, wherein the sensor electrode is configured to sense changes of an irradiated alternating electric field, wherein the changes are caused by an object entering the alternating electric field, and a first shield electrode arranged on the second side of the substrate and serving for shielding the alternating electric field emitted by the sensor electrode from ground.

2. The electrode arrangement according to claim 1, further comprising a second shield electrode on the first side of the substrate and couplable by a conductor path on the first side of the substrate, with evaluation electronics, the second shield electrode being arranged between the sensor electrode and the conductor path and at a spacing from the sensor electrode and from the conductor path and serving for shielding an alternating electric field emitted by the sensor electrode against the conductor path, the sensor electrode, the second shield electrode and the conductor path each being stripe-shaped, the second shield electrode being larger than the conductor path.

3. The electrode arrangement according to claim 2, wherein the sensor electrode is larger than the conductor path.

4. The electrode arrangement according to claim 2, wherein the sensor electrode is larger than the second shield electrode.

5. The electrode arrangement according to claim 2, further comprising a third shield electrode on the first side of the substrate at a spacing from the conductor path, the conductor path being arranged between the second shield electrode and the third shield electrode.

6. The electrode arrangement according to claim 5, wherein the sensor electrode, the second shield electrode and the conductor path are substantially parallel to each other.

7. The electrode arrangement according to claim 5, wherein the sensor electrode is coupled with a resonance circuit, wherein the sensor electrode and the resonance circuit can be applied with an electric voltage, and a phase shift of an electric voltage of the resonance circuit compared to the electric voltage applied is indicative for the approach or the position of the object at the sensor electrode.

8. The electrode arrangement according to claim 7, wherein an output of the resonance circuit coupled with the sensor electrode can be coupled through an amplifying circuit with at least one of the three shield electrodes, in order to bring at least one of the three shield electrodes substantially to the electric potential of the sensor electrode.

9. The electrode arrangement according to claim 8, wherein the amplifying circuit is a driver circuit, and the driver circuit is adapted to drive the current at the shield electrode and to charge the shield electrode with an electric voltage in phase with the electrode voltage of the sensor electrode, and the voltage applied is smaller than the electrode voltage of the sensor electrode.

10. The electrode arrangement according to claim 8, wherein the output is couplable by means of a multiplexer with the amplifying circuit.

11. The electrode arrangement according to claim 7, wherein an inductive component of the resonance circuit is formed by a gyrator.

12. The electrode arrangement according to claim 11, wherein the gyrator comprises an operational amplifier fed back by a capacitor, which acts at an input of the sensor electrode as a virtual inductance and the virtual inductance, together with the sensor electrode and with its load capacitance against ground, constitutes a parallel resonant circuit.

13. The electrode arrangement according to claim 12, wherein an output of the operational amplifier is couplable with an amplifying circuit and at the output of the operational amplifier is provided with an attenuator.

14. The electrode arrangement according to claim 1, wherein the first shield electrode is formed by a conductive and to generally transparent material.

15. The electrode arrangement according to claim 1, wherein at least one coupling electrode is arranged between the sensor electrode and the first shield electrode and couplable with the first shield electrode; and an output of a capacitive sensor connected with the sensor electrode can be coupled through a driver circuit with the coupling electrode in order to bring the coupling electrode and the first shield electrode substantially to the electric potential of the sensor electrode.

16. The electrode arrangement according to claim 15, wherein the driver circuit is adapted to drive the current at the coupling electrode and to charge the coupling electrode with an electric voltage in phase with the electrode voltage of the sensor electrode, the voltage applied being smaller than the electrode voltage of the sensor electrode.

17. The electrode arrangement according to claim 15, wherein the shield electrode and the coupling electrode are capacitively coupled.

18. A system comprising:
an electrode arrangement for a capacitive sensor for detecting a position or an approach of an object, the electrode arrangement comprising a substantially flat substrate having a first side and a second side; a sensor electrode arranged on the first side of the substantially flat substrate, wherein the sensor electrode is configured to sense changes of an irradiated alternating electric field, wherein the changes are caused by an object entering the alternating electric field, and a first shield electrode arranged on the second side of the substrate and serving for shielding the alternating electric field emitted by the sensor electrode from ground,
a grounded display device for detecting a position or an approach of an object to the display device, the electrode arrangement being in the display device in such a way that the second side of the substrate is directed toward the display device, and the first shield electrode serves to shield the alternating electric field emitted by the sensor electrode from the grounded display device.

19. The system according to claim 18, wherein the first shield electrode is DC-couplable or capacitively couplable with a conductive and generally transparent layer situated in front of the display device.

20. The system according to claim 19, wherein the first shield electrode is formed by a conductive and generally transparent layer situated in front of the display device.

21. An apparatus comprising:
an electrode arrangement for a capacitive sensor for detecting a position or an approach of an object, the electrode arrangement comprising a substantially flat substrate having a first side and a second side; a sensor electrode arranged on the first side of the substantially flat substrate, wherein the sensor electrode is configured to sense changes of an irradiated alternating electric field, wherein the changes are caused by an object entering the alternating electric field, and a first shield electrode arranged on the second side of the substrate and serving for shielding, the alternating electric field emitted by the sensor electrode from around,
a grounded display device for detecting a position or an approach of an object to the display device, the electrode arrangement being in the display device in such a way that the second side of the substrate is directed toward the display device, and the first shield electrode serves to shield the alternating electric field emitted by the sensor electrode from the grounded display device,
wherein the first shield electrode is embedded in a transparent protective material in the display device, and the first shield electrode serves to shield the electrode field of the sensor electrode from the grounded display device.

22. The apparatus according to claim 21, wherein the first shield electrode and the at sensor electrode each are embedded in a substrate and wherein the substrate is arranged at the surface opposite the display device of the transparent protective material.

23. The apparatus according to claim 22, wherein the substrate is transparent.

24. The apparatus according to claim 21, wherein the display device is a touch-sensitive screen and the first shield electrode or the sensor electrode is formed by the conductive layers of the touch-sensitive screen, the conductive layers of the touch-sensitive screen being coupled with an evaluation unit for contact detection and with an evaluation unit for approximation detection.

25. The apparatus according to claim 24, wherein the apparatus is adapted to evaluate, above a predetermined first spacing of the object from the display device a movement of the object relative to the display device.

26. The apparatus according to claim 25, wherein the evaluation unit for approximation detection is deactivatable when the spacing of the object from the display device is smaller than the first spacing.

27. The apparatus according to claim 26, wherein the apparatus is adapted to evaluate, below a predetermined second spacing of the object from the display device contact of the display device with the object.

28. The apparatus according to claim 27, wherein the second spacing is greater than the first spacing.

29. The apparatus according to claim 24, wherein the conductive layers of the touch-sensitive screen are coupled by time division with the evaluation unit for contact detection and with the evaluation unit for approximation detection.

30. The apparatus according to claim 24, wherein the first shield electrode comprises the coupling electrode.

31. An electrode arrangement comprising a foil on which a plurality of sensor electrodes and at least one coupling electrode are arranged; wherein the plurality of sensor electrodes are arranged on the side of the coupling electrode and in a predetermined spacing from the coupling electrode, wherein the foil comprises connectors for connecting the sensor electrodes to an evaluation unit and for connecting the sensor electrodes and the coupling electrode to a driver circuit for the production of a substantially field-free space between the sensor electrodes and the coupling electrode, wherein the sensor electrode is configured to sense changes of an irradiated alternating electric field, wherein the changes are caused by an object entering the alternating electric field.

32. A method for making an approach-sensitive display device with a touch-sensitive screen comprising conductive structures for detecting a contact, comprising the steps of: providing a foil on which a plurality of sensor electrodes and at least one coupling electrode are arranged; wherein the plurality of sensor electrodes are arranged on the side of the coupling electrode and in a predetermined spacing from the coupling electrode, wherein the foil comprises connectors for connecting the sensor electrodes to an evaluation unit and for connecting the sensor electrodes and the coupling electrode to a driver circuit, for the production of a substantially field-free space between the sensor electrodes and the coupling electrode, wherein the sensor electrode is configured to sense changes of an irradiated alternating electric field, wherein the changes are caused by an object entering the alternating electric field; applying the foil on the touch-sensitive screen with the coupling electrode directed toward the screen and the coupling electrode into a capacitive coupling with the conductive structures of the touch-sensitive screen.

33. The method according to claim 32, further comprising the step of coupling the foil connections and the conductive structures of the touch-sensitive screen with an evaluation unit for approximation detection, the conductive structures being coupled by time division with the evaluation unit for approximation detection and with an evaluation unit for contact detection.

* * * * *